(12) United States Patent  
Marino (10) Patent No.: US 8,014,444 B1
(45) Date of Patent: Sep. 6, 2011

(54) SYSTEM AND METHOD FOR DC OFFSET, AMPLITUDE AND PHASE IMBALANCE CORRECTION FOR I AND Q BASEBAND CALIBRATION

(75) Inventor: Anthony G. Marino, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 922 days.

(21) Appl. No.: 11/928,147

(22) Filed: Oct. 30, 2007

(51) Int. Cl.
*H03H 7/30* (2006.01)
*H03K 5/159* (2006.01)

(52) U.S. Cl. ......... 375/235; 375/233; 375/234; 375/236

(58) Field of Classification Search ............... 375/235, 375/233, 229, 259, 243
See application file for complete search history.

(56) References Cited

U.S. PATENT DOCUMENTS

| | | | |
|---|---|---|---|
| 5,119,399 A * | 6/1992 | Santos et al. ............. | 375/224 |
| 5,125,008 A * | 6/1992 | Trawick et al. ........... | 375/349 |
| 5,949,821 A | 9/1999 | Emami et al. | |
| 6,044,112 A | 3/2000 | Koslov | |
| 6,122,325 A | 9/2000 | Mogre et al. | |
| 6,925,132 B2 | 8/2005 | Song et al. | |
| 7,010,059 B2 | 3/2006 | Song et al. | |
| 7,130,359 B2 | 10/2006 | Rahman | |
| 7,310,387 B2 | 12/2007 | Kim et al. | |
| 7,319,852 B2 | 1/2008 | Schlegel et al. | |
| 2003/0206603 A1 * | 11/2003 | Husted ...................... | 375/324 |
| 2005/0118963 A1 * | 6/2005 | Chiu ........................ | 455/115.1 |
| 2006/0039506 A1 | 2/2006 | D'Alessandro | |
| 2007/0121757 A1 * | 5/2007 | Chu et al. ................. | 375/296 |
| 2007/0237258 A1 * | 10/2007 | Shakeshaft ............... | 375/296 |
| 2008/0025435 A1 * | 1/2008 | Yamaguchi et al. ...... | 375/298 |
| 2008/0056344 A1 * | 3/2008 | Hidaka ..................... | 375/232 |
| 2008/0285682 A1 * | 11/2008 | Chu et al. ................. | 375/298 |

* cited by examiner

*Primary Examiner* — Chieh M Fan
*Assistant Examiner* — Qutbuddin Ghulamali
(74) *Attorney, Agent, or Firm* — Edell, Shapiro & Finnan, LLC (57) ABSTRACT

An algorithm is provided that computes values for correcting for DC offsets of baseband I and Q signals, compensates for amplitude imbalance between the baseband I and Q signals and compensates for phase imbalance between the baseband I and Q signals. Test signals are injected into the I and Q signal processing paths (either or both of the receiver path and baseband path in a modem). Samples of the I and Q signals produced in the I and Q signal processing paths are generated and analyzed to determine DC offsets of the I and Q signals, amplitude imbalance between the I and Q signals and phase imbalance with respect to a desired orthogonal relationship between the I and Q signals.

17 Claims, 7 Drawing Sheets

FIG.8B AFTER

FIG.8A BEFORE

FIG. 9

FIG. 10A — BEFORE

FIG. 10B — AFTER

US 8,014,444 B1

SYSTEM AND METHOD FOR DC OFFSET, AMPLITUDE AND PHASE IMBALANCE CORRECTION FOR I AND Q BASEBAND CALIBRATION

FIELD OF THE INVENTION

The present invention relates to communication devices that use orthogonal signals in baseband modulation and demodulation, and more particularly to an algorithm that corrects for DC offsets, amplitude imbalance and phase imbalance of the orthogonal signals.

BACKGROUND

In communication devices, such as wireless communication devices that perform short-range and long-range wireless radio communication, it has been the practice to use orthogonal signal processing techniques in which the baseband receive and transmit signals are put into format consisting of an in-phase (I) signal and quadrature-phase (Q) signal, where the Q signal is 90 degrees out of phase with respect to the I signal. Such orthogonal signal processing has the advantage of improving the dynamic range of the received and transmitted signals.

In order to achieve the performance benefits of I and Q signal processing, it is necessary to ensure that the I and Q signals are properly balanced in terms of amplitude and phase with respect to each other. That is, the phase offset relationship of the I and Q signals should be 90 degrees and the amplitudes of the I and Q signals should be substantially the same. In addition, it is desirable to remove DC offsets in the I and Q signals so that both signals vary symmetrically with respect to the same voltage, e.g., zero volts.

Most DC offset correction, amplitude compensation and phase compensation techniques heretofore known require complex (Fourier) signal processing techniques that are not practical in certain communication device platforms. What is needed is an algorithm that does not require complex computations in order to perform corrections for DC offset of I and Q signals, as well as amplitude and phase imbalance compensation between the I and Q signals.

SUMMARY

Briefly, the present invention is directed to an algorithm that computes values for correcting for DC offsets of baseband I and Q signals. The algorithm involves injecting test signals into the I and Q signal processing paths (in either or both of the receiver and transmitter in a modem). Samples of the I and Q signals produced in the I and Q signal processing paths as a result of the test signals are generated and analyzed to determine DC offsets of the I and Q signals, amplitude imbalance between the I and Q signals and phase imbalance with respect to a desired orthogonal (90 degree phase) relationship between the I and Q signals. DC offset correction values are generated for the I and Q signals so that the DC offset corrected I and Q signals vary symmetrically about a predetermined value, e.g., zero volts. At least one amplitude imbalance compensation factor is generated and applied to at least one of the DC offset corrected I and Q signals to produce DC offset corrected and amplitude imbalance compensated I and Q signals that have substantially equal amplitudes. Finally, at least one phase imbalance compensation value is generated for the DC offset corrected and amplitude imbalance compensated I and Q signals. The at least one phase imbalance compensation value is applied to the DC offset corrected and amplitude imbalance compensated I and Q signals to produce DC offset corrected, amplitude imbalance compensated and phase imbalance compensated I and Q signals that have the desired orthogonal phase relationship.

DETAILED DESCRIPTION

The present invention is directed to a system and an algorithm to calculate correction factors that compensate for DC offsets, amplitude and phase imbalance for I and Q channels (signal processing paths) in a baseband signal processor, e.g., modem, to optimize image rejection and improve the dynamic range of a receiver or transmitter in the modem.

Figure 1:
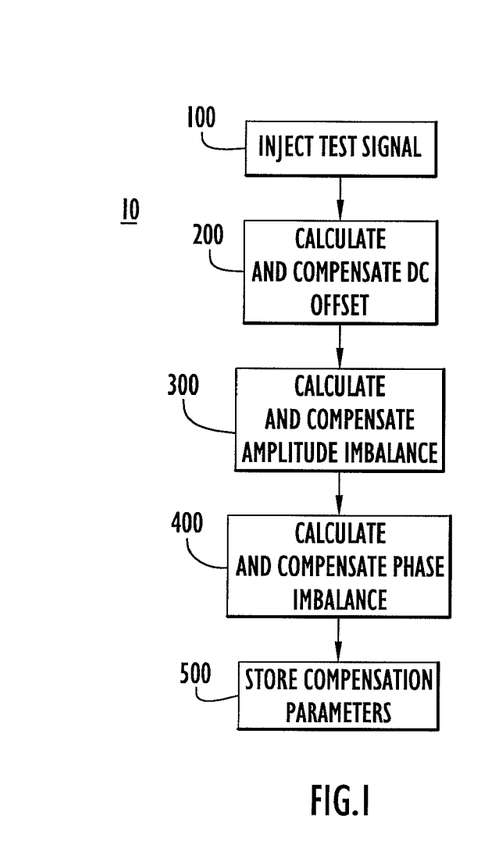
FIG. 1 is a flow chart of the I and Q baseband calibration method according to an embodiment of the present invention.
Figure 2:
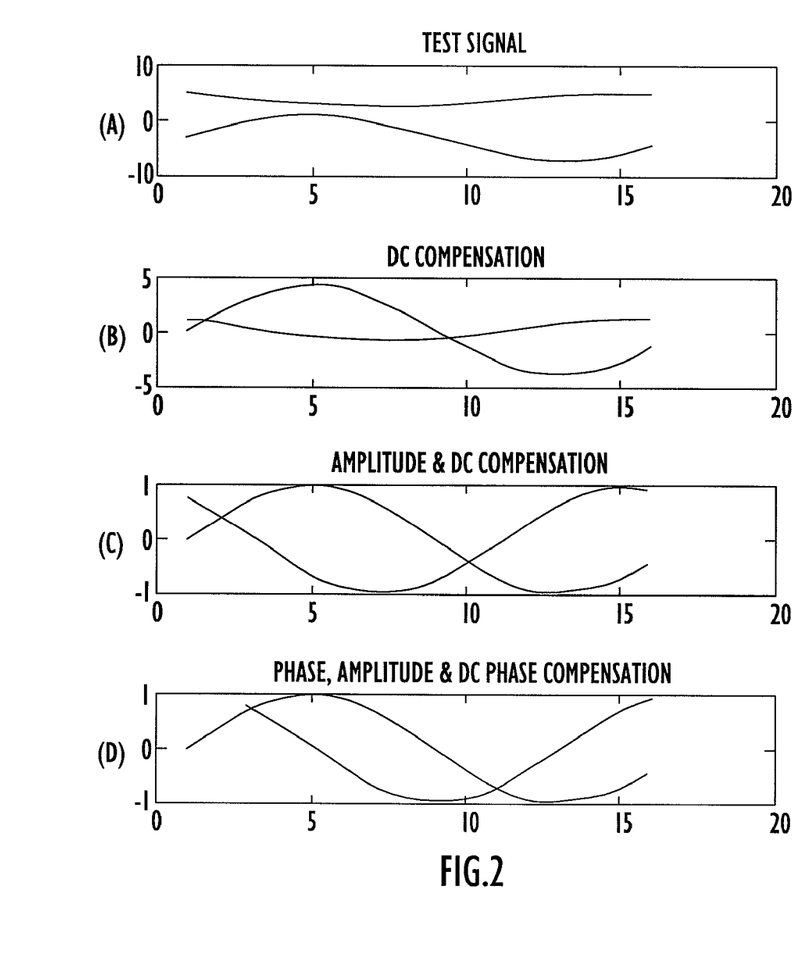
FIG. 2 shows a series of signal plots to illustrate the operations at the various stages of the I and Q baseband calibration method shown in FIG. 1, according to embodiments of the present invention.

With reference initially to FIGS. 1 and 2, the algorithm of the present invention is shown at 10 and is now generally described. Initially, at 100, test signals are generated and injected into the I and Q baseband signal processing paths and the resulting I and Q signals are monitored for direct current (DC) offsets, amplitude differences and orthogonal phase variation (phase offset between the I and Q signals from 90 degrees). Signal plots of the I and Q signals that result from the I and Q test signals, respectively, are shown at (A) in FIG. 2.

At 200, first the DC offset of each of the I and Q signals is analyzed, and an I DC offset correction value is computed for the I signal and a Q DC offset voltage correction value is computed for the Q signal. These offset correction factors are then added (or subtracted) from I and Q signal paths so that the peak amplitudes of the I and Q baseband signals vary symmetrically about a predetermined voltage, e.g., zero (0) volts. Exemplary plots of the DC offset corrected I and Q signals are shown at (B) in FIG. 2.

At the next stage 300 in the process 10, the amplitude imbalance between the DC offset corrected I and Q signals is computed and compensated. This is accomplished by calculating the peak to peak voltage of the I and Q signals and applying an amplitude imbalance compensation factor to the I signal path, for example, so that the amplitude imbalance is minimized. Amplitude compensation may be applied in either or both of the I and Q signal processing paths. When amplitude compensation is applied in only one of the I and Q signal processing paths, then the entire amplitude imbalance compensation factor is applied in that processing path. However, when amplitude imbalance compensation is applied in both signal paths, then the amplitude imbalance compensation factor is appropriately apportioned between an I amplitude imbalance compensation factor that is applied to the I signal processing path and a Q amplitude imbalance compensation factor that is applied to the Q signal processing path. Exemplary plots of the DC offset corrected and amplitude compensated I and Q signals are shown at (C) in FIG. 2.

At 400, the phase imbalance (offset from 90 degree orthogonal relationship) is computed for the DC offset corrected and amplitude compensated I and Q signals. A delay amount is applied in the I and/or Q signal processing paths to achieve the desired 90 degree phase offset (orthogonal relationship). Phase imbalance compensation may be applied in only one or both I and Q signal processing paths. When phase compensation is applied in only one of the I and Q signal processing paths, then the entire phase imbalance compensation is made in that one signal processing path. When phase imbalance compensation is applied in both signal paths, then the phase imbalance compensation value needed to achieve the desired 90 degree phase offset is apportioned between an I phase imbalance compensation value that is applied to the I signal processing path and a Q phase imbalance compensation value that is applied to the Q signal processing path. Exemplary plots of the DC offset corrected, amplitude compensated and phase compensated I and Q signals are shown at (D) in FIG. 2.

At 500, the compensation parameters for DC offset, amplitude imbalance and phase imbalance are stored for subsequent use in the communication device. Alternatively, the device may re-compute the offset and imbalances and update the compensation parameters on a periodic or occasional basis.

Figure 3:
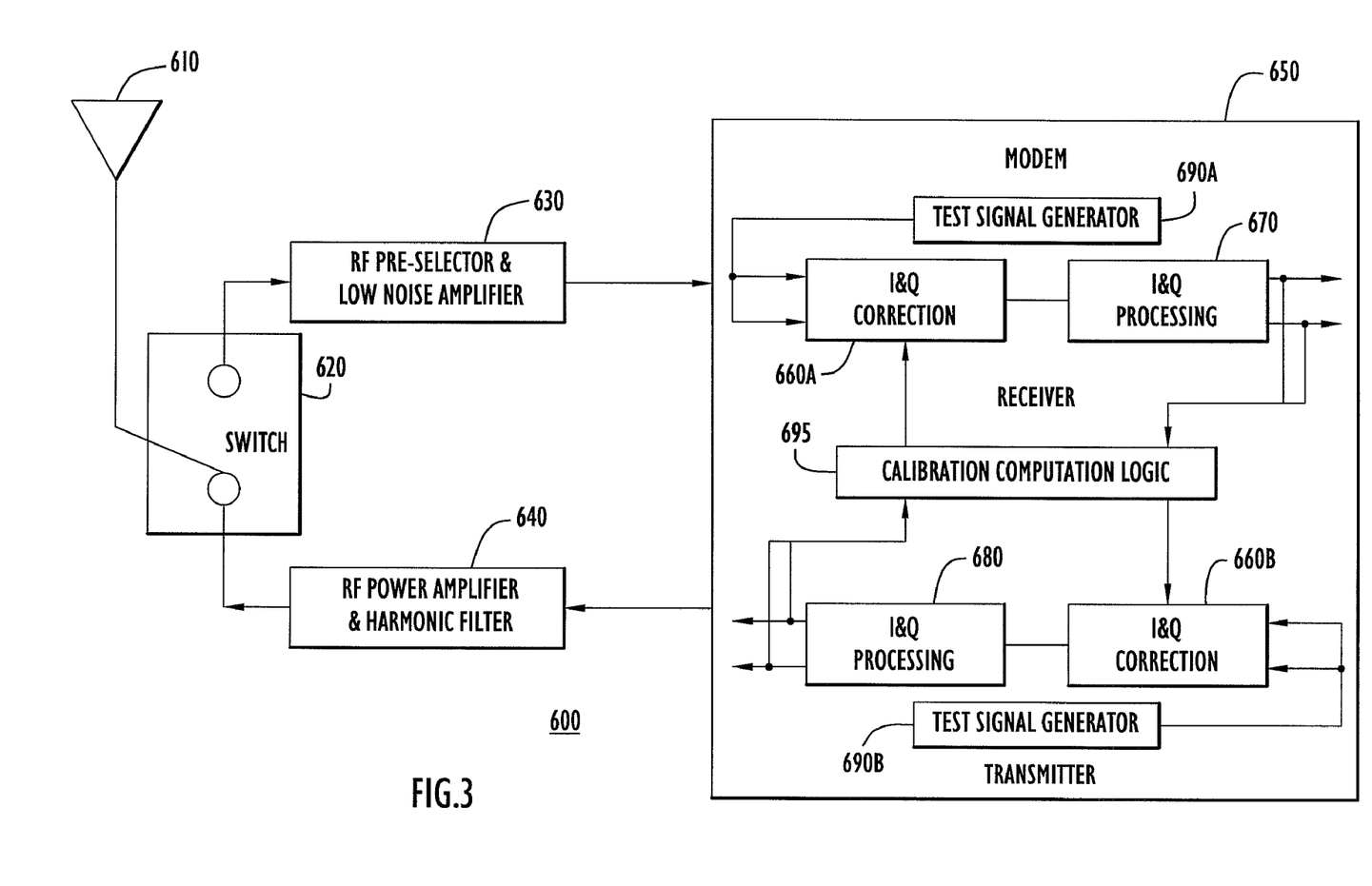
FIG. 3 is a block diagram of a communication device comprising a modem in which the calibration method of the present invention may be employed.

With reference to FIG. 3, what follows is a description of the basic hardware configuration of a communication device in which the algorithm of the present invention may be employed. The communication device, shown generally at reference numeral 600 comprises an antenna 610, a transmit/receive switch 620, radio frequency (RF) pre-selector and low noise amplifier 630 in the receive path and an RF power amplifier (and harmonic filter) 640 in the transmit path. A baseband signal processor or modem 650 is connected to the blocks 630 and 640. It should be understood that between the RF components 630 and 640 and the modem 650 there are mixers that are used to produce the I and Q signals in the receiver path from the received (and downconverted) signal to produce baseband receive I and Q signals, and also in the transmit path to generate an RF signal from baseband modulated I and Q signals.

The modem 650 has a receiver path that comprises an I and Q correction block 660A and an I and Q signal processing block 670, and a transmitter path that comprises an I and Q signal processing block 680 and an I and Q correction block 660B. The I and Q signal processing block 670 performs the baseband demodulation procedures for any one of a variety of communication protocols now known or hereinafter developed. Likewise, the I and Q signal processing block 680 performs the baseband modulation procedures for any communication protocol now known or hereinafter developed. The correction blocks 660A and 660B may consist of the same components, as described hereinafter in conjunction with FIG. 4. While not shown in FIG. 3, it is understood that there are analog-to-digital converters (ADCs) and digital-to-analog converters (DACs) at appropriate points in the signal processing paths of the modem 650.

There is a test signal generator 690A for the receiver path in the modem 650 and a test signal generator 690B for the transmitter path in the modem 650. The test signal generator 690A generates I and Q test signals that are supplied to the I and Q signal processing block 670 via the correction block 660 in the receiver path, and the test signal generator 680B generates I and Q test signals that are supplied to the I and Q signal processing block 680 via the correction block 660B in the transmitter path. The modem 650 further comprises a calibration computation logic section 695 that receives as input samples of the baseband demodulated I and Q signals generated by the I and Q processing block 670 in the receiver path and samples of the baseband modulated I and Q signals output by the I and Q signal processing block 680 in the transmitter path. The calibration computation logic section 695 performs the algorithm 10 shown in FIGS. 1 and 2 to generate correction parameters that are supplied to the correction blocks 660A and 660B in the receiver and transmitter paths, respectively, of the modem 650. Details of the algorithm 10 are described hereinafter in conjunction with FIGS. 5-10A and 10B.

It should be understood that there may be a single test signal generator that generates the I and Q test signals for both the transmitter and receiver signal paths in the modem 650. Also, one with ordinary skill in the art would also recognize that switches may be needed to disconnect signals to and from the RF signal paths in order to inject the test signals into the transmitter and receiver signal paths. The calibration algorithm 10 described herein may be performed for I and Q signals in the receiver path, transmitter path or both paths. Furthermore, it should be understood that there may be ADC blocks that sample the I and Q signal outputs of the I and Q processing block 670 in the receiver path and of the I and Q signal outputs of the I and Q processing block 680 in the transmitter path. To maintain the simplicity of the diagrams, these ADC blocks are not shown in FIG. 3.

Furthermore, while FIG. 3 purports to show a half-duplex communication device, it is to be understood that the present invention is not limited to a communication device that operates in the half-duplex mode. The calibration/and correction techniques described herein can be used in any type of communication device whether half-duplex, full-duplex, etc., that uses I and Q signals at baseband. Moreover, as shown in FIG. 3, the calibration computation logic module 695 computes DC offset correction values, at least one amplitude compensation factor and at least one phase compensation value for I and Q signal processing modules that are in a receiver path and/or transmitter path of the modem 650.

Figure 4:
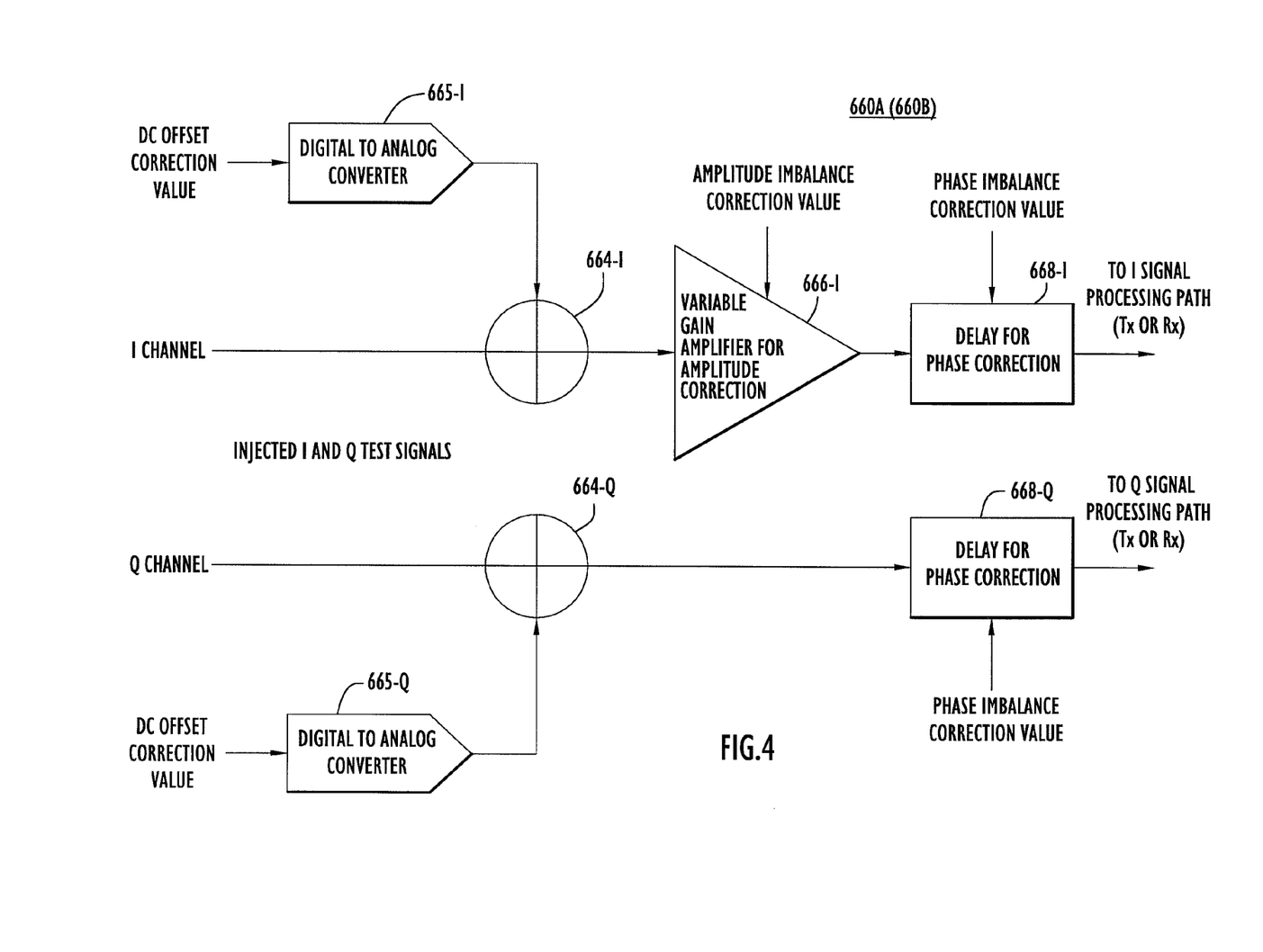
FIG. 4 is a block diagram illustrating correction components in the modem according to an embodiment of the present invention.

Referring now to FIG. 4, an example of the components in I and Q correction blocks 660A (and 660B) is shown. As indicated above, the correction blocks 660A and 660B may comprise essentially the same components. The correction block 660A comprises correction components for each of the I and Q channels. For example, for the I channel, there is an adder 664-I for DC offset correction, a variable gain amplifier (VGA) 666-I for amplitude imbalance compensation and a delay circuit 668-I for phase imbalance compensation. There is also a DAC 665-I that receives a DC offset correction value from the calibration computation logic 695 to generate an analog DC offset correction value that is supplied to the adder 665-I. Similarly, for the Q channel, there is a DAC 665-Q that receives a DC offset correction value for the Q channel from the calibration computation logic 695. The correction components in the Q channel comprise an adder 664-Q and a delay circuit 668-Q. The VGA 666-I receives an amplitude compensation factor from the calibration computation logic 695 to perform an amplitude imbalance compensation in the I channel and delay circuits 668-I and 668-Q receive phase imbalance compensation values from the calibration computation logic 695. It should be understood that there are several variations to the correction blocks 660A and 660B that may be made without departing from the scope and spirit of the present invention. For example, it is possible that the VGA may reside in only one or both of the I-channel correction path and the Q-channel correction path so that the amplitude imbalance is corrected in only one (as shown in FIG. 4) or both of the I channel and the Q channel. Similarly, a delay circuit may be used in only one (as shown in FIG. 4) or both of the I and Q channel correction paths, to compensate for phase imbalances in the orthogonality of the I and Q signals.

The correction blocks 660A and 660B each comprise an I (first) correction module and a Q (second) correction module. The first correction module applies an I DC offset correction value generated by the calibration computation logic module 695 to apply the I DC offset correction value to the I signal processing path so that the I signal processing path produces a DC offset corrected I signal that varies symmetrically about 0 volts. The second correction module applies a Q DC offset correction value to the Q signal processing path so that the Q signal processing path produces a DC offset corrected Q signal that varies symmetrically about 0 volts. The calibration computation logic module 695 generates at least one amplitude imbalance compensation factor that is applied to at least one of the first and second correction modules (in one or both of the correction blocks 660A and 660B) that applies the amplitude imbalance compensation factor to at least one of the I and Q signal processing paths so that the I and Q signal processing paths produce DC offset corrected and amplitude imbalance compensated I and Q signals, respectively, that have substantially equal amplitudes. Finally, the calibration computation logic module 695 generates at least one phase imbalance compensation factor that is supplied to at least one of the first and second correction modules (in one or both of the correction blocks 660A and 660B) so that the I and Q signal processing paths produce the DC offset corrected, amplitude imbalance compensated and phase imbalance compensated I and Q signals, respectively, that have the desired orthogonal relationship.

While FIG. 4 shows components for making corrections in the I and Q signal paths using analog signal processing techniques, it should be understood that the corrections may be made in the modem 650 at points where the signals are digital signals, and as such digital computations would be used to make the corrections. There are many forms that the test signals may take. In one embodiment, the test signals generated by the test signal generators 690A and 690B have the form:

$$I(x)=Idc+Iae*\sin((2*pi*(x-1)/N)+(Ipe*pi/180))$$

$$Q(x)=Qdc+Qae*\cos((2*pi*(x-1)/N)+(Qpe*pi/180))$$

where the variables are defined as follows:
  ae=4.0 Test Signal I Channel Amplitude Error (Vp-p)
  Idc=−3.0 Test Signal I Channel DC Offset (V)
  Ipe=0.0 Test Signal I Channel Phase Error (Deg)
  Qae=1.0 Test Signal Q Channel Amplitude Error (Vp-p)
  Qdc=4.0 Test Signal Q Channel DC Offset (V)
  Qpe=40.0 Test Signal Q Channel Phase Error (Deg)
  Fts=600000 Test Signal Frequency
  Fs=9600000 Sampling Frequency
  N=Fs/Fts Number of samples per test signal cycle Since the parameters of the test signals injected into the I and Q signal processing paths, respectively, are known, the calibration computation logic 695 can analyze the samples taken of the I and Q signals produced as a result of the test signals to measure the variations created by the I and Q signal processing blocks. These variations are then used to compute the necessary correction/compensation parameters.

Figure 5:
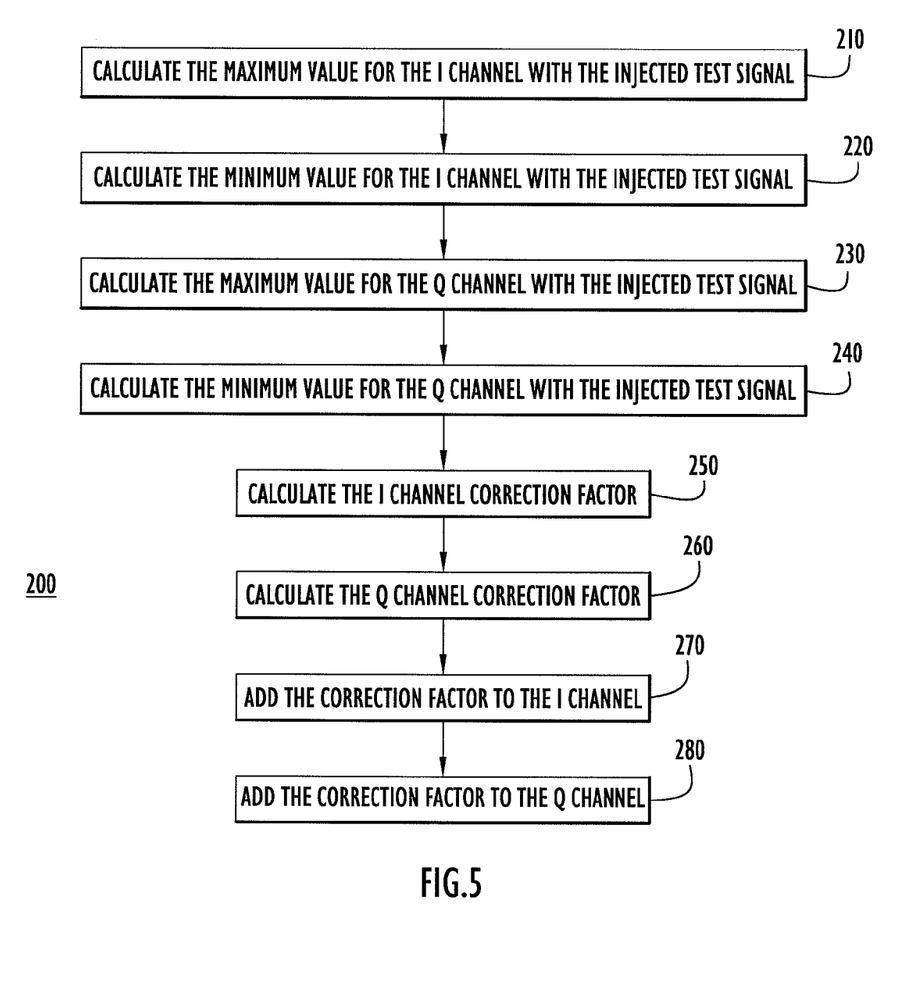
FIG. 5 is a flow chart of the DC offset calculation and compensation stage of the baseband calibration method according to an embodiment of the present invention.

Turning now to FIG. 5, the DC offset detection and correction computation 200 is described in detail. The DC offset in each of the I and Q channels is analyzed and offset voltage correction values are computed and then added (or subtracted) from the I and Q channels so that the peak amplitudes of the I and Q signals symmetrically vary about 0 volts. At 210, the maximum value is determined for the I signal as a result of the test signal injected therein and at 220 the minimum value for the I signal is determined. Similarly, the maximum value of the Q signal as a result of the injected test signal is determined at 230 and the minimum value of the Q signal is determined at 240. Next, at 250, the I DC correction factor is computed based on the maximum and minimum values determined at 210 and 220 so that the I signal varies symmetrically with respect to 0 volts. Likewise, at 260, the Q DC correction is computed based on the maximum and minimum values of the Q signal determined at 230 and 240 so that the Q signal varies symmetrically with respect to 0 volts. The I DC offset correction factor is applied to the I channel at 270 (via the DAC 665-I shown in FIG. 4) and the Q DC offset correction factor is applied to the Q channel at 280 (via the DAC 665-Q shown in FIG. 4).

Figure 6A:
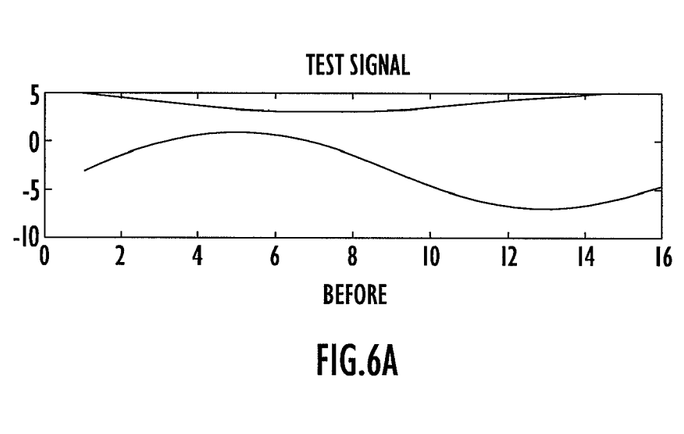
FIGS. 6A and 6B illustrate plots of signals in the I and Q channels of the modem before and after, respectively, DC offset compensation.
Figure 6B:
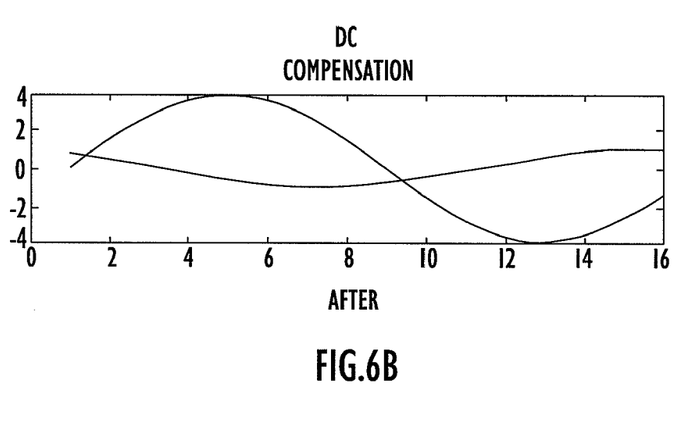

FIG. 6A illustrates the I and Q signals prior to DC offset correction. It can be seen in FIG. 6A that both signals do not vary symmetrically about 0 volts. After the DC offset correction values are applied to the I and Q channels, the DC offset corrected I and Q signals vary symmetrically about 0 volts as shown in FIG. 6B.

Figure 7:
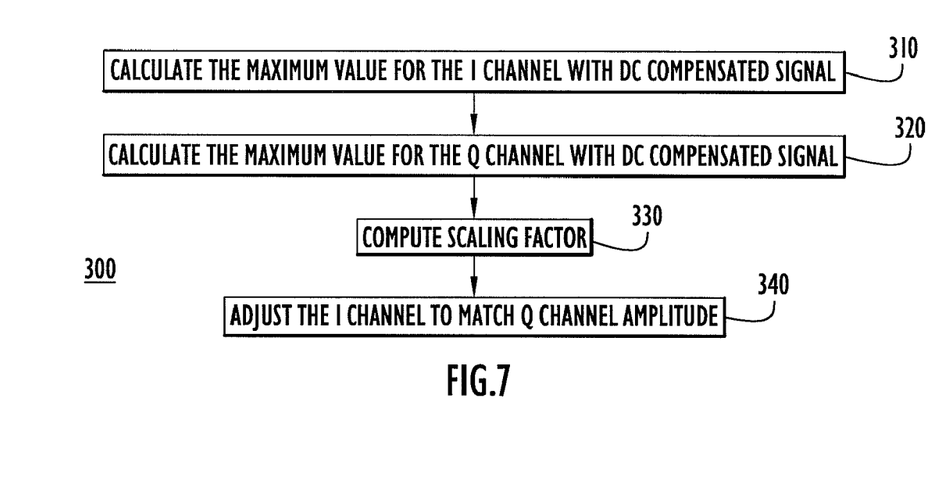
FIG. 7 is a flow chart of the amplitude imbalance calculation and compensation stage of the baseband calibration method according to an embodiment of the present invention.

Turning now to FIG. 7, the amplitude imbalance detection and compensation stage 300 is described. At 310, the maximum value of the DC offset corrected I signal is computed. Next, at 320, the maximum value of the DC offset corrected Q signal is computed. Next, the ratio of these maximum values (max I to max Q or max Q to max I) is computed at 330. This ratio can be used to determine the appropriate amplitude imbalance compensation factor (scaling factor) that is applied to a VGA in one or both of the I and Q channels as described above in connection with FIG. 3. At 340, an amplitude compensation is made in one or both of the I and Q channels using the compensation factor computed at 330.

Figure 8A:
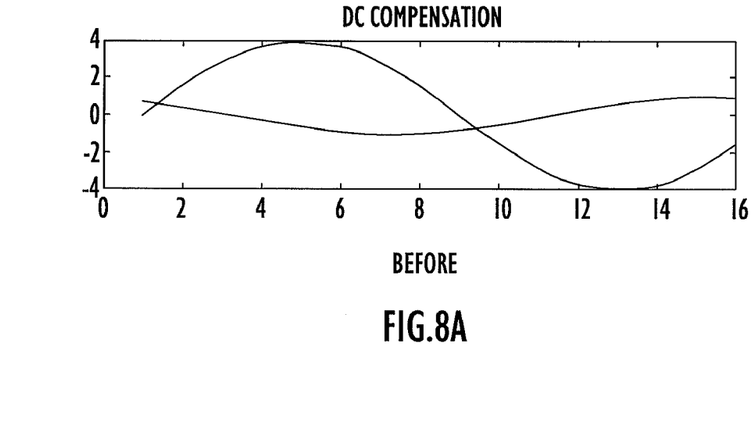
FIG. 8A illustrates plots of signals in the I and Q channels of the modem after DC offset compensation but before amplitude imbalance compensation.
Figure 8B:
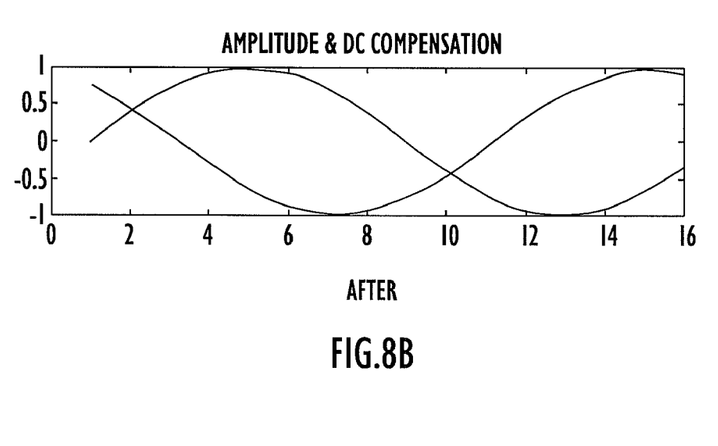
FIG. 8B illustrates plots of signals in the I and Q channels of the modem after DC offset and amplitude offset compensation.

FIG. 8A illustrates the signals in the I and Q channels after DC offset correction, but before amplitude imbalance compensation. Note that both signals vary symmetrically about 0 volts, but the amplitude of one signal is significantly greater than the amplitude of the other signal. FIG. 8B illustrates the signals in the I and Q channels after amplitude imbalance compensation, and shows that the DC offset corrected and amplitude imbalance compensated I and Q signals have substantially equal amplitudes.

Figure 9:
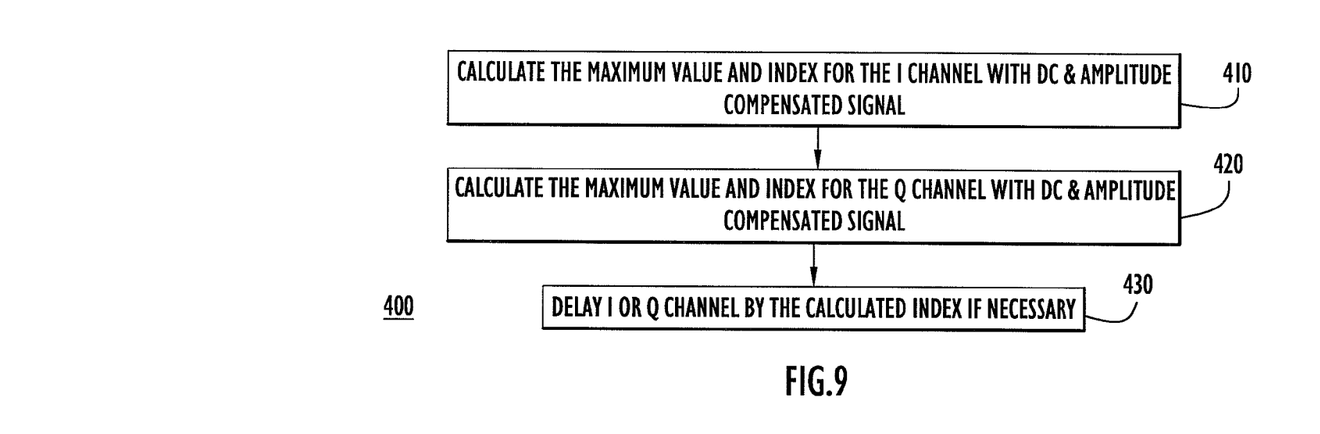
FIG. 9 is a flow chart of the phase imbalance computation and compensation stage of the baseband calibration method according to an embodiment of the present invention.

Turning now to FIG. 9, the phase imbalance detection and compensation stage 400 is described. At 410, the maximum value for the DC corrected and amplitude compensated I signal is determined and its associated time of occurrence index (also simply referred to herein as the "index") is computed. Similarly, at 420, the maximum value for the DC corrected and amplitude compensated Q signal is determined and its associated index is computed. The indices indicate when the peak or maximum value of the respective I and Q signals occur. Next, at 430, the phase imbalance correction factor for the I and/or Q channel is computed based on the indices determined at 410 and 420 and the desired 90 degrees offset between the I and Q channels. The phase imbalance correction factor(s) is/are then applied to the delay circuit(s) as shown in FIG. 3.

Figure 10A:
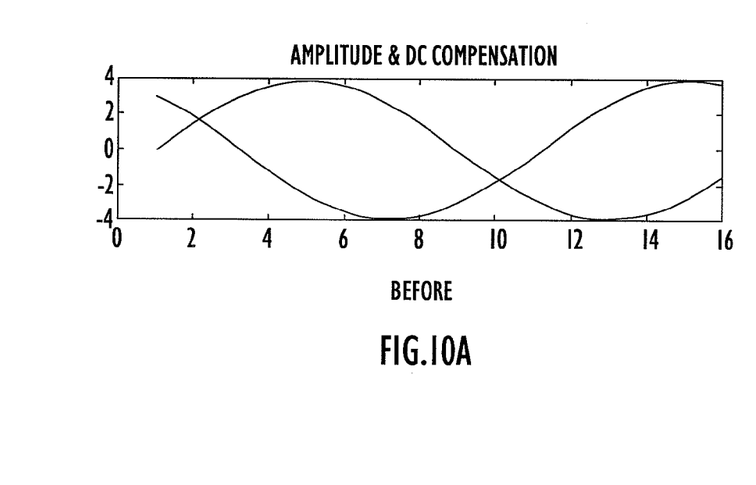
FIG. 10A illustrates plots of signals in the I and Q channels of the modem after DC offset correction and amplitude imbalance compensation but before phase imbalance compensation.
Figure 10B:
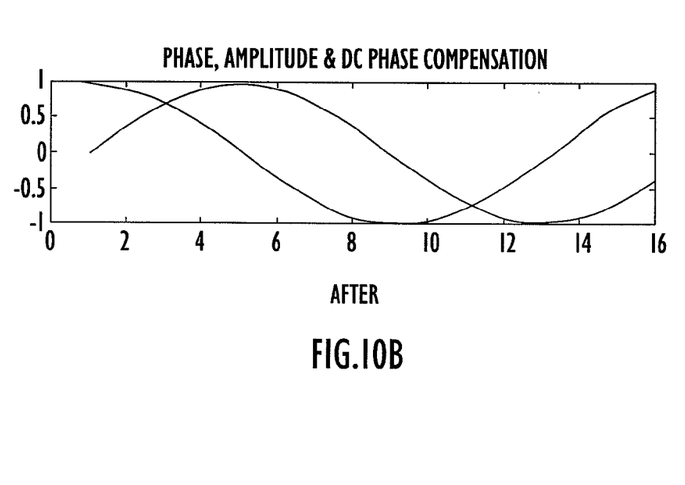
FIG. 10B illustrates plots of signals in the I and Q channels of the modem after DC offset, amplitude imbalance compensation and phase imbalance compensation.

FIG. 10A illustrates signals in the I and Q channels after DC offset correction and amplitude imbalance compensation but before phase imbalance compensation. FIG. 10B illustrates signals in the I and Q channels after phase imbalance compensation, and this figure shows that the maximum values of the I and Q signals are out of phase by 90 degrees.

The table below illustrates an estimate of image rejection performance as a function sample rate.

| SAMPLES | PHASE ERROR +/− (degrees) | AMPLITUDE RESOLUTION (%) | Voltage Imbalance (dB) | Image Rejection (dB) |
|---|---|---|---|---|
| 8 | 45.00 | 29.289322 | 3.010300 | 5.6 |
| 16 | 22.50 | 7.612047 | 0.687693 | 13.4 |
| 32 | 11.25 | 1.921472 | 0.168521 | 20.0 |
| 64 | 5.63 | 0.481527 | 0.041926 | 26.1 |
| 128 | 2.81 | 0.120454 | 0.010469 | 32.2 |
| 256 | 1.41 | 0.030118 | 0.002616 | 38.2 |
| 512 | 0.70 | 0.007530 | 0.000654 | 44.3 |
| 1024 | 0.35 | 0.001882 | 0.000164 | 50.3 |

This table reveals quite clearly that the image rejection performance of the algorithm described herein improves as the sample rate increases. However, this improvement is at the expense of the computation resources necessary to handle sampled data at higher rates.

It is to be understood that the calibration computation logic 695 shown in FIG. 3 may be implemented in numerous ways without departing from the scope and spirit of the present invention. Examples of implementations include, without limitation, fixed digital logic gates, programmable digital logic gates, instructions or code that is executed by a digital signal processor, and instructions or code that is/are encoded (stored) on a computer readable memory medium and executed by a computer (e.g., a microcontroller or microprocessor). To this end, the calibration algorithm according to the present invention may be embodied in a modem for use in a communication device, wherein the modem comprises I and Q signal processing modules; a test signal generator that generates I and Q test signals that are supplied to the I and Q signal processing modules which in response produce I and Q signals; a calibration computation logic module that receives as input samples of the I and Q signals and computes DC offsets of the I and Q signals, amplitude imbalance between the I and Q signals and phase imbalance between the I and Q with respect to a desired orthogonal phase relationship, and wherein the calibration computation module generates DC offset correction values for correcting DC offsets of the I and Q signals, respectively, at least one amplitude imbalance compensation factor and at least one phase imbalance compensation value; and first and second correction modules coupled to the I and Q signal processing modules, respectively, wherein the first and second correction modules correct for DC offsets of the I and Q signals, respectively, and at least one of the first and second correction modules corrects for amplitude imbalance and for phase imbalance between the I and Q signals.

Moreover, the present invention may be embodied by with instructions encoded on a computer readable medium (e.g., software), where when the instructions are executed by a computer, they cause the computer to detect and correct for DC offsets in in-phase (I) and quadrature-phase (Q) baseband signal processing paths in a communication device, and to compensate for amplitude and phase imbalance between the I and Q signal processing paths, by: generating I and Q test signals that are supplied to the I and Q signal processing paths, respectively, that in response produce I and Q signals, respectively; generating samples of the I and Q signals, respectively; analyzing the samples of the I and Q signals to determine DC offsets of the I and Q signals, amplitude imbalance between the I and Q signals and phase imbalance between the I and Q with respect to a desired orthogonal phase relationship; computing I and Q DC offset correction values for correcting the DC offsets of the I and Q signals, at least one amplitude imbalance compensation factor for compensating for the amplitude imbalance between the I and Q signals and at least one phase imbalance compensation value for compensating for the phase imbalance between the I and Q signals; and applying the DC offset correction values to the I and Q signal processing paths, respectively, to produce DC offset corrected I and Q signals, applying the at least one amplitude imbalance compensation factor to at least one of the I and Q signal processing paths and the phase imbalance compensation value to at least one of the I and Q signal processing paths, to produce DC offset corrected, amplitude and phase imbalance compensated I and Q signals.

The system and methods described herein may be embodied in other specific forms without departing from the spirit or essential characteristics thereof. The foregoing embodiments are therefore to be considered in all respects illustrative and not meant to be limiting.

What is claimed is:

1. A method for detecting and correcting for DC offsets, amplitude imbalance and phase imbalance in the in-phase (I) and quadrature-phase (Q) baseband signal processing paths of a communication device, comprising:

a. injecting an I test signal into the I signal processing path to produce an I signal and a Q test signal into the Q signal processing path to produce a Q signal;

b. analyzing the I signal and the Q signal to determine their DC offsets and computing I and Q DC offset correction values to correct for the DC offsets of the I signal and Q signal, respectively;

c. applying the I and Q DC offset correction values in the I and Q signal processing paths, respectively, to produce DC offset corrected I and Q signals;

d. analyzing the DC offset corrected I and Q signals to determine an amplitude imbalance and computing at least one amplitude compensation factor to compensate for the amplitude imbalance, wherein computing the at least one amplitude imbalance compensation factor comprises determining a maximum value of the DC offset corrected I signal and a maximum value of the DC offset corrected Q signal, determining a ratio between the maximum values of the DC offset corrected I and Q signals, respectively, and computing the at least one amplitude imbalance compensation factor from the ratio;

e. applying the amplitude imbalance correction factor to at least one of the DC offset corrected I and Q signals to produce DC offset corrected and amplitude compensated I and Q signals, wherein applying comprises applying the at least one amplitude imbalance compensation factor to at least one of the I and Q signal processing paths so that the I and Q signal processing paths produce DC offset corrected and amplitude compensated I and Q signals, respectively, that have substantially the same amplitude;

f. analyzing the DC offset corrected and amplitude compensated I and Q signals to determine phase imbalance with respect to a desired orthogonal relationship and computing a phase imbalance compensation value to compensate for the phase imbalance; and g. applying the phase imbalance compensation value to at least one of the DC offset corrected and amplitude compensated I and Q signals to produce orthogonal DC offset corrected and amplitude compensated I and Q signals.

2. The method of claim 1, wherein said (d) analyzing comprises computing an I amplitude compensation factor and a Q amplitude compensation factor for the I and Q signal processing paths, respectively, and wherein (e) applying comprises applying the I amplitude compensation factor to the I signal processing path and applying the Q amplitude compensation factor to the Q signal processing path.

3. The method of claim 1, wherein (f) analyzing comprises computing an I phase imbalance compensation value and a Q phase imbalance compensation value, and wherein (g) applying comprises applying the I and Q phase imbalance values to the I and Q signal processing paths, respectively.

4. The method of claim 1, wherein (b) analyzing comprises calculating maximum and minimum values for the I signal and maximum and minimum values for the Q signal, computing the I DC offset correction value from the maximum and minimum values for the I signal so that the I signal varies symmetrically about 0 volts and computing the Q DC offset correction value from the maximum and minimum values for the Q signal so that the Q signal varies symmetrically about 0 volts.

5. The method of claim 1, wherein (f) analyzing comprises computing maximum values of the DC offset corrected and amplitude imbalance compensated I and Q signals, respectively, and when the respective maximum values occur, determining whether and by how much there is a phase imbalance with respect to the desired orthogonal relationship between the DC offset corrected and amplitude imbalance compensated I and Q signals.

6. The method of claim 1, wherein (a) through (g) are performed for I and Q signal processing paths that are in a receiver path and/or transmitter path of a modem in the communication device.

7. A method for detecting and correcting for DC offsets of in-phase (I) and quadrature-phase (Q) baseband signal processing paths of a modem in a communication device, and for amplitude imbalance and phase imbalance between the I and Q signal processing paths, comprising:

generating I and Q test signals that are supplied to the I and Q signal processing paths, respectively, that in response produce I and Q signals, respectively;

generating samples of the I and Q signals, respectively;

analyzing the samples of the I and Q signals to determine DC offsets of the I and Q signals, amplitude imbalance between the I and Q signals and phase imbalance between the I and Q with respect to a desired orthogonal phase relationship;

computing I and Q DC offset correction values for correcting the DC offsets of the I and Q signals, at least one amplitude imbalance compensation factor for compensating for the amplitude imbalance between the I and Q signals and at least one phase imbalance compensation value for compensating for the phase imbalance between the I and Q signals, wherein computing the at least one amplitude imbalance compensation factor comprises determining a maximum value of the DC offset corrected I signal and a maximum value of the DC offset corrected Q signal, determining a ratio between the maximum values of the DC offset corrected I and Q signals, respectively, and computing the at least one amplitude imbalance compensation factor from the ratio; and applying the DC offset correction values to the I and Q signal processing paths, respectively, to produce DC offset corrected I and Q signals, applying the at least one amplitude imbalance compensation factor to at least one of the I and Q signal processing paths and the phase imbalance compensation value to at least one of the I and Q signal processing paths, to produce DC offset corrected, amplitude and phase imbalance compensated I and Q signals, and wherein applying comprises applying the at least one amplitude imbalance compensation factor to at least one of the I and Q signal processing paths so that the I and Q signal processing paths produce DC offset corrected and amplitude compensated I and Q signals, respectively, that have substantially the same amplitude.

8. The method of claim 7, wherein computing the I and Q DC offset correction values comprises determining maximum and minimum values from samples of the I and Q signals, respectively, computing the I DC offset correction value so that when applied to the I signal processing path the I signal varies symmetrically about 0 volts and computing the Q DC offset correction value so that when applied to the Q signal processing path the Q signal varies symmetrically about 0 volts.

9. The method of claim 8, wherein computing the at least one phase imbalance compensation value comprises determining when peaks of the I and Q DC offset corrected and amplitude compensated signals, respectively, occur and computing the at least one phase imbalance compensation value therefrom to ensure that there is a desired orthogonal phase relationship between the I and Q DC offset corrected and amplitude imbalance compensated signals, and wherein applying comprises applying the at least one phase imbalance compensation value to at least one of the I and Q signal processing paths so that the I and Q signal processing paths produce the DC offset corrected, amplitude imbalance compensated and phase imbalance compensated I and Q signals.

10. The method of claim 7, wherein generating I and Q test signals, generating samples of the I and Q signals, analyzing the samples, computing I and Q DC offset correction values, and applying are performed for I and Q signal processing paths that are in a receiver path and/or transmitter path of a modem in the communication device.

11. A modem for use in a communication device, comprising:

I and Q signal processing modules;

a test signal generator that generates I and Q test signals that are supplied to the I and Q signal processing modules which in response produce I and Q signals;

a calibration computation logic processor that receives as input samples of the I and Q signals and computes DC offsets of the I and Q signals, amplitude imbalance between the I and Q signals and phase imbalance between the I and Q with respect to a desired orthogonal phase relationship, and wherein the calibration computation logic processor generates DC offset correction values for correcting DC offsets of the I and Q signals, respectively, at least one amplitude imbalance compensation factor and at least one phase imbalance compensation value, wherein the calibration computation logic processor determines maximum values of the DC offset corrected I signal and DC offset corrected Q signal, respectively, and computes the at least one amplitude imbalance compensation factor based on a ratio of the maximum values of the DC offset corrected I and Q signals, respectively, and supplies the at least one amplitude imbalance compensation factor to at least one of the first and second correction modules; and first and second correction modules coupled to the I and Q signal processing modules, respectively, wherein the first and second correction modules correct for DC offsets of the I and Q signals, respectively, and at least one of the first and second correction modules corrects for amplitude imbalance and for phase imbalance between the I and Q signals, wherein at least one of the first and second correction modules applies the amplitude imbalance compensation factor to at least one of the I and Q signal processing paths so that the I and Q signal processing paths produce DC offset corrected and amplitude imbalance compensated I and Q signals, respectively, that have substantially equal amplitudes.

12. The modem of claim 11, wherein the calibration computation logic processor determines maximum and minimum values from samples of the I signal and maximum and minimum values from samples of the Q signal to compute an I DC offset correction value that is supplied to the first correction module and computes a Q DC offset correction value that is supplied to the second correction module so that the Q signal varies symmetrically about 0 volts, wherein the first correction module applies the I DC offset correction value to the I signal processing path so that the I signal processing path produces a DC offset corrected I signal that varies symmetrically about 0 volts and the second correction module applies the Q DC offset correction value to the Q signal processing path so that the Q signal processing path produces a DC offset corrected Q signal that varies symmetrically about 0 volts.

13. The modem of claim 11, wherein the calibration computation logic processor determines maximum values of the DC offset corrected and amplitude imbalance compensated I and Q signals, and when the respective maximum values occur to determine whether and by how much there is a phase imbalance with respect to a desired orthogonal relationship between the DC offset corrected and amplitude imbalance compensated I and Q signals to produce the at least one phase imbalance compensation factor that is supplied to at least one of the first and second correction modules so that the I and Q signal processing paths produce the DC offset corrected, amplitude imbalance compensated and phase imbalance compensated I and Q signals, respectively, that have the desired orthogonal relationship.

14. The modem of claim 11, wherein the calibration computation logic processor computes DC offset correction values, at least one amplitude compensation factor and at least one phase imbalance compensation value for I and Q signal processing modules that are in a receiver path and/or transmitter path of the modem.

15. A non-transitory computer readable medium that is encoded with instructions which, when executed by a computer, cause the computer to detect and correct for DC offsets in in-phase (I) and quadrature-phase (Q) baseband signal processing paths in a communication device, and to compensate for amplitude and phase imbalance between the I and Q signal processing paths, by:

generating I and Q test signals that are supplied to the I and Q signal processing paths, respectively, that in response produce I and Q signals, respectively;

generating samples of the I and Q signals, respectively;

analyzing the samples of the I and Q signals to determine DC offsets of the I and Q signals, amplitude imbalance between the I and Q signals and phase imbalance between the I and Q with respect to a desired orthogonal phase relationship, wherein the instructions for analyzing comprise instructions for determining maximum values of the DC offset corrected I and Q signals, respectively, and wherein the instructions for computing comprise instructions for computing the at least one amplitude imbalance compensation factor based on a ratio between the maximum values of the DC offset corrected I and Q signals, respectively;

computing I and Q DC offset correction values for correcting the DC offsets of the I and Q signals, at least one amplitude imbalance compensation factor for compensating for the amplitude imbalance between the I and Q signals and at least one phase imbalance compensation value for compensating for the phase imbalance between the I and Q signals;

applying the DC offset correction values to the I and Q signal processing paths, respectively, to produce DC offset corrected I and Q signals; and applying the at least one amplitude imbalance compensation factor to at least one of the I and Q signal processing paths and the phase imbalance compensation value to at least one of the I and Q signal processing paths, to produce DC offset corrected, amplitude and phase imbalance compensated I and Q signals, wherein the instructions for applying the at least one amplitude imbalance compensation factor comprise instructions for applying the at least one amplitude imbalance compensation factor to at least one of the I and Q signal processing paths so that the I and Q signal processing paths produce DC offset corrected and amplitude imbalance compensated I and Q signals, respectively, that have substantially equal amplitudes.

16. The non-transitory computer readable medium of claim 15, wherein the instructions for analyzing the I and Q signals comprise instructions for determining maximum and minimum values from samples of the I signal and maximum and minimum values from samples of the Q signal, and wherein the instructions for computing comprise instructions for computing an I DC offset correction value and a Q DC offset correction value, and wherein the instructions for applying comprise instructions for applying the I DC offset correction value to the I signal processing path so that the I signal processing path produces the DC offset corrected I signal that varies symmetrically about 0 volts and applying the Q DC offset correction value to the Q signal processing path so that the Q signal processing path produces the DC offset correction Q signal that varies symmetrically about 0 volts.

17. The non-transitory computer readable medium of claim 15, wherein the instructions for analyzing comprise instructions for determining when maximum values of the DC offset corrected and amplitude imbalance compensated I and Q signals, respectively, occur to determine whether and by how much there is a phase imbalance with respect to a desired orthogonal relationship between the DC offset corrected and amplitude imbalance compensated I and Q signals, and wherein the instructions for computing comprise instructions for computing the at least one phase imbalance compensation value, and wherein the instructions for applying comprise instructions for applying the at least one phase imbalance compensation value to at least one of the I and Q signal processing paths so that the I and Q signal processing paths produce the DC offset corrected, amplitude imbalance compensated and phase imbalance compensated I and Q signals, respectively, that have the desired orthogonal relationship.

* * * * *